United States Patent
Wu et al.

(10) Patent No.: US 9,606,430 B2
(45) Date of Patent: Mar. 28, 2017

(54) METHOD OF AEROSOL PRINTING A SOLDER MASK INK COMPOSITION

(71) Applicant: Xerox Corporation, Norwalk, CT (US)

(72) Inventors: Yiliang Wu, Oakville (CA); Kurt Halfyard, Mississauga (CA)

(73) Assignee: XEROX CORPORATION, Norwalk, CT (US)

(*) Notice: Subject to any disclaimer, the term of this patent is extended or adjusted under 35 U.S.C. 154(b) by 0 days.

(21) Appl. No.: 14/471,967

(22) Filed: Aug. 28, 2014

(65) Prior Publication Data

US 2016/0062230 A1    Mar. 3, 2016

(51) Int. Cl.
  *B41J 2/21*   (2006.01)
  *G03F 1/68*   (2012.01)
  (Continued)

(52) U.S. Cl.
  CPC .................. *G03F 1/68* (2013.01); *B41J 2/01* (2013.01); *H05K 3/3452* (2013.01); *H05K 3/285* (2013.01);
  (Continued)

(58) Field of Classification Search
  CPC ... B41J 2/01; B41J 2/211; B41J 2/1433; B41J 2/17; B41J 2/17593; B41J 2/2107; B41J 2/1755; B41J 2/2114; B41J 11/0015; B41J 11/002; B41J 2/2056; B41J 2/21; B41J 2/0057; B41J 3/60; C09D 11/36; C09D 11/40; C09D 11/30; C09D 11/38; C09D 11/322; C09D 11/328; C09D 11/101; C09D 11/005; C09D 11/54; C09D 11/52;
  (Continued)

(56) References Cited

U.S. PATENT DOCUMENTS

| 5,229,252 A * | 7/1993 | Flynn ..................... G03F 7/027 430/280.1 |
| 6,458,509 B1 | 10/2002 | Haruta |
| 2008/0090963 A1 | 4/2008 | Rajaraman et al. |

FOREIGN PATENT DOCUMENTS

| EP | 0109553 A2 | 5/1984 |
| JP | 2002338612 A | 11/2002 |
| JP | 2012025894 A * | 2/2012 ............. C08G 59/44 |

OTHER PUBLICATIONS

Author Unknown, Synperonic® F 108, Sigma-Aldrich, http://sigmaaldrich.com/catalog/product/fluka/07579?lang=en®ion-US, accessed Jun. 26, 2014, pp. 1-3.
(Continued)

*Primary Examiner* — Manish S Shah
(74) *Attorney, Agent, or Firm* — MH2 Technology Law Group LLP

(57) ABSTRACT

A method of digitally printing a solder mask. The method includes providing a solder mask ink composition including: 1) a resin and 2) a solvent in an amount of at least 20% by weight relative to the total weight of the solder mask ink composition. The composition has a viscosity that is less than 1000 cps at a shear rate of 10 $s^{-1}$ and a temperature of 25° C. An aerosol stream is generated from the solder mask ink composition with a pneumatic atomizer using an atomization gas. The aerosol stream is directed through a nozzle and focused using a sheath gas onto a substrate while changing the position of the nozzle with respect to the substrate to selectively deposit a solder mask pattern. The solder mask pattern is cured.

19 Claims, 7 Drawing Sheets

(51) Int. Cl.
*B41J 2/01* (2006.01)
*H05K 3/34* (2006.01)
*H05K 3/28* (2006.01)

(52) U.S. Cl.
CPC ............... *H05K 2203/0545* (2013.01); *H05K 2203/0783* (2013.01)

(58) Field of Classification Search
CPC .... B41M 5/0011; B41M 5/0017; B41M 7/00; B41M 7/0072; B41M 5/52; B41M 5/5218
USPC .................................................. 347/95–105
See application file for complete search history.

(56) References Cited

OTHER PUBLICATIONS

Author Unknown, Butyl Carbitol™, Diethylene Glycol Monobutyl Ether, The Dow Chemical Company, Mar. 2004, pp. 1-2.
Author Unknown, Product Safety Assessment, Dipropylene Glycol n-Butyl Ether, The Dow Chemical Company, Apr. 15, 2008, pp. 1-6.
Author Unknown, Aerosol Jet Technology, Optomec Additive Manufacturing, http://www.optomec.com/printed-electronics/aerosol-jet-technology/, accessed Jul. 7, 2014, pp. 1-3.
Author Unknown, Aerosol Jet System Configurations, Optomec Additive Manufacturing for Electronic Applications, http://www.optomec.com/printed-electronics/aerosol-jet-printers/, accessed Jul. 7, 2014, pp. 1-3.
Author Unknown, Aerosol Jet Materials, Optomec Additive Manufacturing, http://www.optomec.com/printed-electronics/aerosol-jet-materials/, accessed Jul. 7, 2014, pp. 1-3.
Author Unknown, Emerging Applications, 3D Printed Electronics for Mil-Aero Applications, Optomec Aerosol Jet Systems Emerging Applications, http://optomec.com/printed-electronics/aj-emerging-applications/, accessed Jul. 7, 2014, pp. 1-4.
Author Unknown, Core Applications, Conformal Printed Antenna, Optomec Aerosol Jet Core Applications, http://optomec.com/printed-electronics/aj-core-applications/, accessed Jul. 7, 2014, pp. 1-3.
Author Unknown, Core Applications, Semiconductor Packaging, Optomec Aerosol Jet Core Applications, http://optomec.com/printed-electronics/aj-core-applications/, accessed Jul. 7, 2014, pp. 1-4.
Author Unknown, Emerging Applications, Touch Screen Displays, Optomec Aerosol Jet Systems Emerging Applications, http://www.optomec.com/printed-electronics/aj-emerging-applications/, accessed Jul. 7, 2014, pp. 1-3.
Author Unknown, Emerging Applications, Solar Cells, Optomec Aerosol Jet Systems Emerging Applications, http://optomec.com/printed-electronics/aj-emerging-applications/, accessed Jul. 7, 2014, pp. 1-3.
Author Unknown, Emerging Applications, Optomec Aerosol Jet Systems Emerging Applications, http://optomec.com/printed-electronics/aj-emerging-applications/, accessed Jul. 7, 2014, pp. 1-3.
Yiliang Wu et al., "Solder Mask Ink Composition", U.S. Appl. No. 14/471,893, filed Aug. 28, 2014.

* cited by examiner

METHOD OF AEROSOL PRINTING A SOLDER MASK INK COMPOSITION

DETAILED DESCRIPTION

Field of the Disclosure

The present disclosure is directed to a method of aerosol printing a solder mask ink composition.

Background

Digital manufacturing of electronics is a global trend. Digital manufacturing not only simplifies process complexity by reducing the number of manufacturing steps, but also minimizes the chemical waste generated during the fabrication process. For example, ink-jet based digital printing is now being used for depositing legend inks in the PCB industry.

Solder mask resists (often green materials but can be any color) are employed for most current printed circuit boards ("PCB"). One conventional method for patterning solder masks is by photolithography. This process has several drawbacks. First, because photolithography is a multiple-step process, it is a major contributor to the total cost of PCB manufacturing. Secondly, photolithographic materials require modification to the main component so that unexposed materials can be developed (washed away) to form the desired patterns. The modification deteriorates the chemical and physical resistance of the final cured solder mask. Third, the first step of photolithography is non-selective or blanket coating of the PCB board. During the coating process, via holes in PCB are often partially or completely filled with solder mask. Removing the solder mask from high aspect ratio via holes is a very difficult task.

Screen printing methods have also been developed for depositing solder mask resist. Although screen printing can overcome the via hole plugging issue, screen printing often yields solder mask with low resolution and poor registration. In addition, screen printing generally requires a relatively flat substrate surface. Printed circuit boards with relief structures on the surface are difficult or impossible to screen print solder mask thereon.

Digital printing of solder mask would have a major impact on the PCB industry and may help to overcome one or more of the aforementioned issues. One such digital printing technique, inkjet printing, has been attempted for depositing solder mask. However, inkjet printing technology is limited to very low viscosity ink (e.g. <20 cps). On the other hand, solder mask compositions, which are composed of high performance polymers, have very high viscosity (e.g. >10,000 cps). Dilution of solder mask materials to jettable viscosity can result in a very thin layer with pinholes which cannot function as a solder mask. For this reason, attempts to deposit solder masks using inkjet technology have had limited success.

Another digital printing method known in the art is aerosol printing. A conventional aerosol printer 20 is shown in FIG. 2. Aerosol printer 20 includes atomizer 22, into which an amount of source fluid 24 to be atomized can be introduced. The atomizer 22 can form an aerosol comprising droplets of the source fluid that are entrained into a gas flow introduced through conduit 26, referred to herein as the atomization gas flow. The aerosol is passed through a virtual impactor 28, which can act to remove excess gas and thereby densify the aerosol. The densified aerosol then flows to a deposition head 30. A sheath gas flowing through conduits 32 can be used to focus the aerosol into a tight beam prior to jetting of the aerosol stream from a nozzle 34 onto a desired substrate. The position of the nozzle with respect to the substrate can be digitally controlled to selectively deposit a desired deposition pattern. The general process of digital printing using aerosol printer 20 is well known in the art. However, the inventors of the present disclosure are not aware of any conventional process for depositing solder resist by aerosol printing methods.

Further, solder mask compositions, which are composed of high performance polymers, have very high viscosity (e.g. >10,000 cps) that is not suitable for an aerosol printing process. Further, dilution of solder mask materials to an acceptable viscosity for aerosol printing is not straight forward. This is in part due to the relatively high temperatures involved and the potential for reduction of resist quality caused by dilution.

Resist materials are employed in a wide variety of applications other than as solder masks in PCB manufacturing. For example, other technologies include manufacture of integrated circuits and 3D electronics. Thus, a resist composition that can be deposited using a digital printing method would be a desirable advancement in the art of resist mask manufacturing.

SUMMARY

An embodiment of the present disclosure is directed to a method of digitally printing a solder mask. The method comprises providing a solder mask ink composition comprising: 1) a resin and 2) a solvent in an amount of at least 20% by weight relative to the total weight of the solder mask ink composition. The composition has a viscosity that is less than 1000 cps at a shear rate of $10\ s^{-1}$ and a temperature of 25° C. An aerosol stream is generated from the solder mask ink composition with a pneumatic atomizer using an atomization gas. The aerosol stream is directed through a nozzle and focused using a sheath gas onto a substrate while changing the position of the nozzle with respect to the substrate to selectively deposit a solder mask pattern. The solder mask pattern is cured.

Another embodiment of the present disclosure is directed to a method of aerosol printing a resist mask. The method comprises providing an ink composition comprising: 1) an epoxy resin and 2) a solvent in an amount of at least 20% by weight relative to the total weight of the ink composition. The composition has a viscosity that is less than 1000 cps at a shear rate of $10\ s^{-1}$ and a temperature of 25° C. An aerosol stream is generated from the ink composition with a pneumatic atomizer using an atomization gas. The aerosol stream is directed through a nozzle and focused using a sheath gas onto a substrate while changing the position of the nozzle with respect to the substrate to selectively deposit a resist mask pattern; The resist mask pattern is cured.

It is to be understood that both the foregoing general description and the following detailed description are exemplary and explanatory only and are not restrictive of the present teachings, as claimed.

BRIEF DESCRIPTION OF THE DRAWINGS

The accompanying drawings, which are incorporated in and constitute a part of this specification, illustrates embodiments of the present teachings and together with the description, serve to explain the principles of the present teachings.

FIG. 5A, no surfactant; FIG. 5B, 1 wt % SDBS anionic surfactant; FIG. 5C, 1 wt % SDS anionic surfactant; FIG. 5D, 0.5 wt % Synperonic F108 non-ionic surfactant; FIG. 5E, 1 wt % Synperonic F108 non-ionic surfactant.

Figure 1:
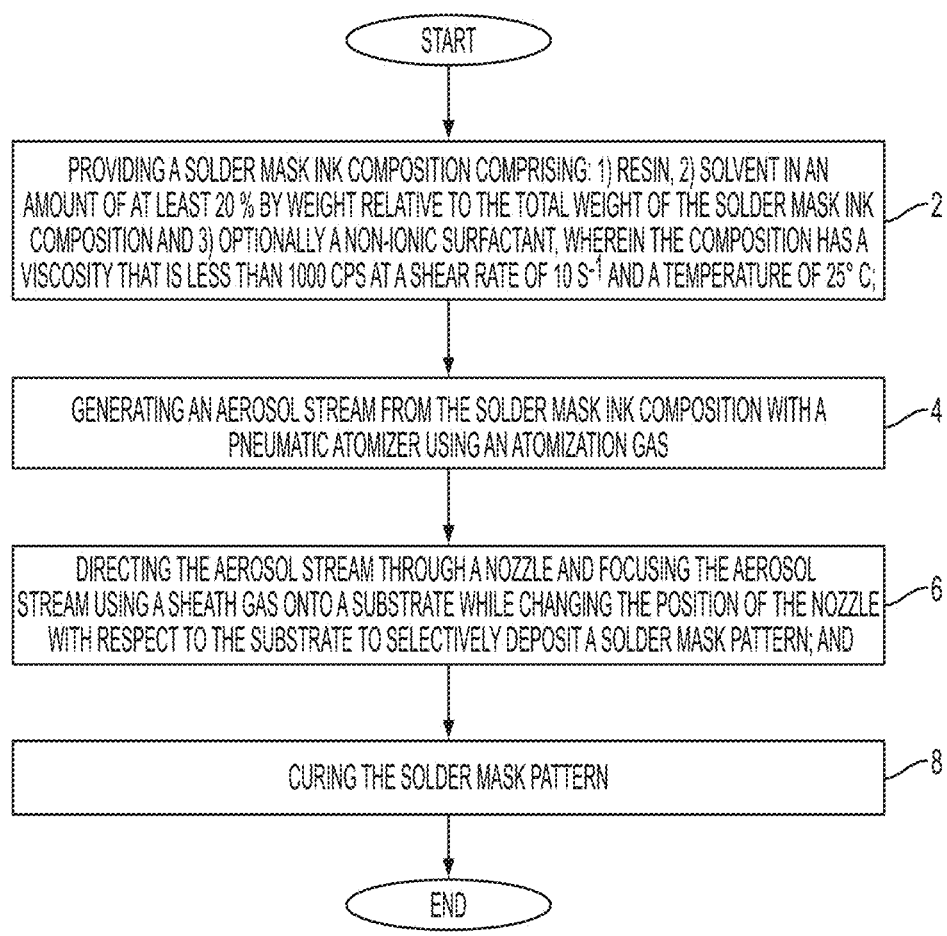
FIG. 1 is a flow diagram of a method of aerosol printing a resist mask, according to an embodiment of the present disclosure.

It should be noted that some details of the figure have been simplified and are drawn to facilitate understanding of the embodiments rather than to maintain strict structural accuracy, detail, and scale.

DESCRIPTION OF THE EMBODIMENTS

Reference will now be made in detail to embodiments of the present teachings, examples of which are illustrated in the accompanying drawings. In the drawings, like reference numerals have been used throughout to designate identical elements. In the following description, reference is made to the accompanying drawings that form a part thereof, and in which is shown by way of illustration, specific exemplary embodiments in which the present teachings may be practiced. The following description is, therefore, merely exemplary.

An embodiment of the present disclosure is directed to a method of digitally printing a solder mask, as illustrated in FIG. 1. Referring to block 2 of FIG. 1, the method includes providing a solder mask ink composition comprising: 1) a resin and 2) a solvent in an amount of at least 20% by weight relative to the total weight of the solder mask resist composition. Referring to block 4, an aerosol stream is generated from the solder mask ink composition with a pneumatic atomizer using an atomization gas. Referring to blocks 6 and 8, the aerosol stream is directed through a nozzle and focusing the aerosol steam using a sheath gas onto a substrate while changing the position of the nozzle with respect to the substrate to selectively deposit a solder mask pattern; and the solder mask pattern is then cured.

In an embodiment, the solder mask ink composition has a viscosity that is less than 1000 cps at a shear rate of 10 $s^{-1}$ and greater than 30 cps at a shear rate of 495 $s^{-1}$, both measured at a temperature of 25° C. In an embodiment, the solder mask ink composition has a viscosity that is less than 800 cps at a shear rate of 10 $s^{-1}$ and greater than 50 cps at a shear rate of 495 $s^{-1}$ and a temperature of 25° C. Thus, in contrast to conventional screen ink, embodiments of the composition can have a viscosity that is less than 1000 cps, such as less than 800 cps or less than 500 cps at a shear rate of 10 $s^{-1}$ and a temperature of 25° C. In contrast to inkjet inks, the ink composition of this invention has a viscosity that is greater than 30 cps, such as greater than 50 cps, or greater than 100 cps at a shear rate of 495 $s^{-1}$ at temperature of 25° C. In an embodiment, the ink composition has a viscosity ranging from about 100 to about 200 cps at a shear rate ranging from about 10 to about 495 $s^{-1}$ andat a temperature of 25° C. This relatively low viscosity makes the solder mask ink composition suitable for use in an aerosol printer.

The solder mask ink compositions of the present application can include any epoxy resin that is suitable for forming a resist mask. In an embodiment, the undiluted epoxy resin can have a viscosity that is greater than 10,000 cps, such as from 15,000 cps to 25,000 cps. In an embodiment, the epoxy resin is selected from the group consisting of a bisphenol A epoxy resin, a phenol formaldehyde resin (also known as a Novolak resin), an acrylic acid modified epoxy and a cycloaliphatic or heterocyclic rings based epoxy with one or more crosslinkers selected from the group consisting of phenols, amines, and anhydrides. Examples of these epoxy resins are well known in the art.

In an embodiment, the epoxy resin is a commercially available resist, such as a solder mask paste. One example of a commercially available solder mask paste is TAIYO S-222NA, which comprises a bisphenol A epoxy resin and is available from Taiyo America Inc. Such conventional formulations cannot be directly used for aerosol printing because their viscosity is too high. The novel aerosol printable formulations of the present application can be obtained by diluting commercial solder mask formulations with compatible solvents together with a proper surfactant additive to achieve suitable rheology.

In other embodiments, aerosol jettable solder mask compositions can be formulated directly from epoxy resins, pigments, solvents, surfactants, adhesion promoters, and other additives, rather than using commercially available solder mask formulations as a starting material.

Any suitable amount of epoxy resin can be employed in the wet, diluted resist composition that will result in the final resist mask having suitable characteristics after curing. Examples of suitable epoxy resin amounts range from about 50% to about 80% by weight relative to the total weight of the solder mask ink composition, such as about 60 or 65% to about 75%.

The solvent and the optional surfactant of the solder mask ink compositions are chosen so that they are effective to adjust the ink rheology of the epoxy resin while using a relatively small amount of solvent and surfactant. The ability to use relatively small amounts of the solvent and surfactant to achieve the desired viscosity can allow for a relatively high solids content and reduce the effect of dilution on the final, cured resist properties. For instance, solvents and surfactants of the present application were shown to have little or no adverse effect on the chemical and physical properties of the final cured solder mask when compared with the same solder mask formulations prepared without the solvent and surfactant.

The solvent employed in the solder mask ink composition can be a dialkylene glycol monoalkyl ether, such as a diethylene glycol monoalkyl ether or a dipropylene glycol monoalkyl ether. In an embodiment, the solvent is a diethylene glycol monoalkyl ether of the following formula:

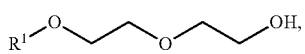

where $R^1$ is a $C_3$ to $C_6$ alkyl group. For example, the diethylene glycol monoalkyl ether can be butyl carbitol. Other suitable solvents include, for example, alkoxybenzenes such as anisole; $C_5$ to $C_8$ alcohols such as pentanols or hexanols and $C_2$ to $C_4$ alkane diols such as ethylene glycol. In an embodiment, the solvent is an alcohol having a suitable boiling point and/or vapor pressure, as described herein.

The solvent can be employed in any suitable amount that reduces the viscosity of the epoxy resin sufficiently for aerosol jet printing and still allows formation of a patterned solder mask with acceptable characteristics. For example, the amount of solvent can be at least 20% by weight relative to the total weight of the solder mask ink composition. In other examples, the amount of solvent can range from about 25% to about 50%, such as about 30% to about 40% or 45% by weight relative to the total weight of the solder mask ink composition.

The solvent can be chosen to have a boiling point that is higher than the temperature at which the aerosol printer operates. In an embodiment, the boiling point is at least 110° C., such as at least 135° C., 140° C., 180° C., or at least 205° C. at atmospheric pressure.

The solvent can be chosen to have any vapor pressure that is suitable for the particular aerosol printer employed at the chosen printer operation temperature. In an embodiment, the vapor pressure is less than 15 mmHg, such as less than 10 mmHg, or less than 5 mmHg, or less than 1 mmHg, or less than 0.5 mmHg at 20° C.

The optional non-ionic surfactant can be employed if the solvent diluted resin produces a film this is not smooth or that exhibits de-wetting or agglomeration. Examples of non-ionic surfactants include polysorbates such as polysorbate 20 (polyoxyethylene (20) sorbitan monolaurate), polysorbate 40 (polyoxyethylene (20) sorbitan monopalmitate), polysorbate 60 (polyoxyethylene (20) sorbitan monostearate), polysorbate 80 (polyoxyethylene (20) sorbitan monooleate); polyglycerol polyricinoleate, Octadecanoic acid [2-[(2R,3S,4R)-3,4-dihydroxy-2-tetrahydrofuranyl]-2-hydroxyethyl]ester, Octadecanoic acid [(2R,3S,4R)-2-[1,2-bis(1-oxooctadecoxy)ethyl]-4-hydroxy-3-tetrahydrofuranyl]ester, $C_8$ to $C_{22}$ long chain alcohols such as 1-octadecanol, Cetylstearyl alcohol, Hexadecan-1-ol and cis-9-octadecen-1-ol; substituted or unsubtituted octylphenol in which the substituents can include a polyethoxyethanol group (e.g., to form octylphenoxypolyethoxyethanol) or any other substituent that will form a non-ionic surfactant with octylphenol; Polyethylene glycol monoisohexadecyl ether; Dodecanoic acid 2,3-dihydroxypropyl ester; glucosides such as lauryl glucoside, octylglucoside and decyl glucoside; fatty acid amides such as cocamide diethanolamine and cocamide monoethanolamine; and nonionic surfactants that have a hydrophilic polyethylene oxide chain and an aromatic hydrocarbon lipophilic or hydrophilic group, such as Nonoxynol-9 and Triton X-100.

In an embodiment, the non-ionic surfactant is a polyalkylene glycol. For example, the non-ionic surfactant can be a block co-polymer comprising at least one polyethylene glycol block and at least one polypropylene glycol block, such as polyethylene glycol-block-polypropylene glycol-block-polyethylene glycol or a triblock copolymer composed of a central hydrophobic chain of polyoxypropylene (poly(propylene oxide)) flanked by two hydrophilic chains of polyoxyethylene (poly(ethylene oxide)). An example of a commercially available non-ionic surfactant is SYNPERONIC F108, available from Aldrich.

The non-ionic surfactant can be employed in any suitable amount that will provide a patterned resist with acceptable characteristics. For example, the amount of non-ionic surfactant can be at least 0.01% by weight relative to the total weight of the solder mask ink composition. In other examples, the amount of non-ionic surfactant can range from about 0.05% to about 5%, such as about 0.5% to about 3% by weight relative to the total weight of the solder mask ink composition.

Figure 2:
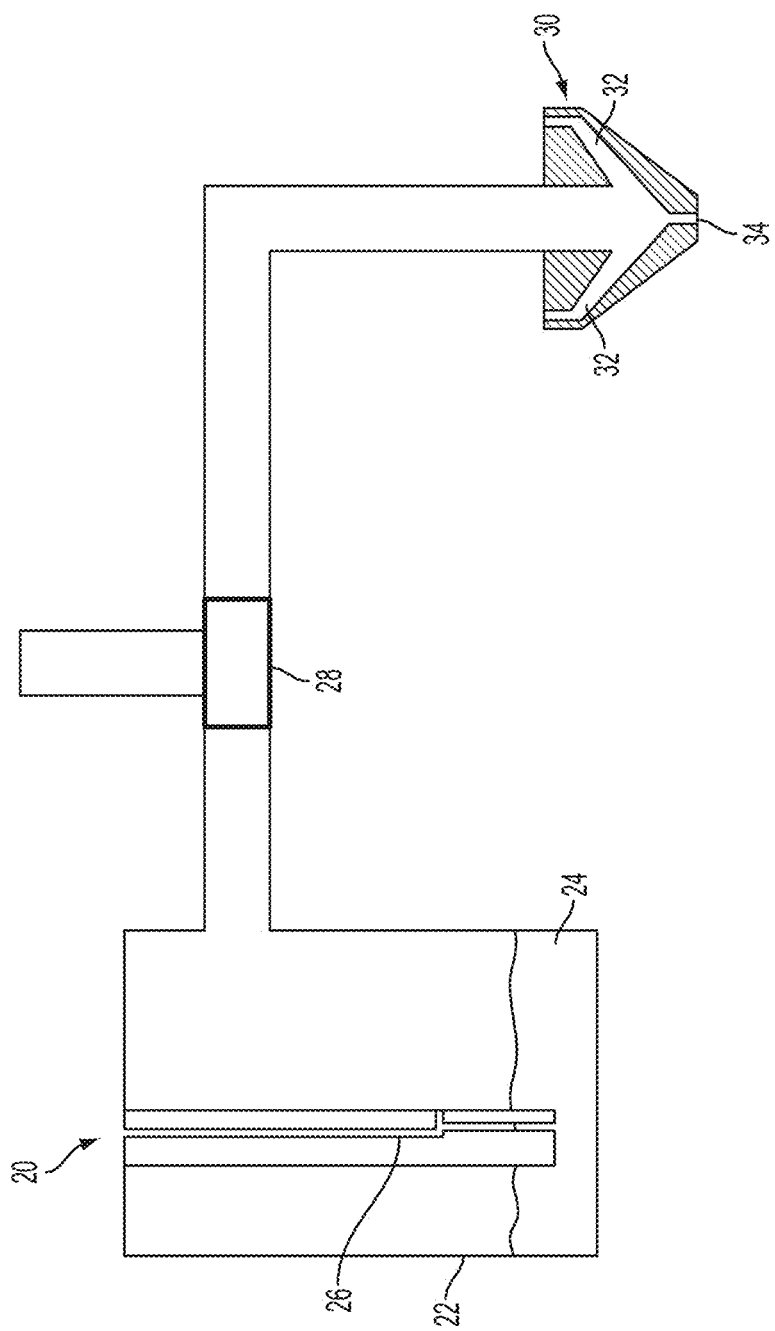
FIG. 2 shows a schematic drawing of an example of a conventional aerosol printer that can be used in the printing methods of the present disclosure.

Any other ingredients suitable for use in resists can also optionally be included in the compositions of the present disclosure. Such ingredients include, for example, colorants, clays, silica, metal oxide particles, and adhesion promoters. The other ingredients should be able to allow formation of aerosols and have little or no unwanted side effects on the final cured properties. In particular, the other ingredients, if exist in particle forms, should have a particle size less than 3 microns, including less than 1 micron, or less than 500 nm. One of ordinary skill in the art would readily be able to determine other ingredients that can be employed Referring again to block 4 of FIG. 1, an aerosol stream is generated from the resist compositions of the present disclosure using an aerosol printer. Any suitable aerosol printer can be employed. An example of a conventional aerosol printer 20 is shown in FIG. 2, and is described in the background section above.

In the methods of the present application, the compositions described herein can be employed as the source fluid 24 of aerosol printer 20. The solder resist in aerosol form is directed through nozzle 34 onto a substrate while changing the position of the nozzle with respect to the substrate to selectively deposit a solder resist mask pattern.

The nozzle 34 can have any suitable dimension for making the mask pattern being deposited. In an embodiment, nozzle 34 is from about 100 micron to about 10 mm in size, such as about 500 microns to about 5 mm, or about 750 microns to about 2 or 3 mm. In case where the nozzle is a circle aperture, the number refers to the diameter of the aperture; and in cases where the nozzle is an oval shape, the number refers that the longer axis of the oval, as is well understood in the art.

The atomization gas flow rate introduced into atomizer 22 via conduit 26 can be any suitable flow rate that will provide the desired atomization of the solder resist and resulting aerosol flow. Example atomization gas flow rates range from about 900 SCCM to about 1400 SCCM, such as about 1000 SCCM to about 1300 SCCM or about 1100 SCCM to about 1200 SCCM. The sheath gas introduced to nozzle 34 via conduit 32 can also have any desired flow rate for focusing the gas. Example flow rate ranges from about 200 SCCM to about 1300 SCCM, such as about 500 SCCM to about 1000 SCCM, or about 600 SCCM to about 900 SCCM.

In an embodiment, the atomization gas flow rate is greater than the sheath gas flow rate. For example, the atomization gas flow rate can range from about 50 SCCM to about 200 SCCM greater than the flow rate of the sheath gas, such as about 100 SCCM or about 150 SCCM greater.

The aerosol stream can include any suitable amount of solder mask resist. In an embodiment, the aerosol steam includes at least 2.0 mg/min dry weight of solder mask resist, such as 2.2 or 2.5 mg/min or more.

The substrate onto which the resist mask is applied can be any suitable substrate, such as a semiconductor, metal, polymer, ceramic or glass substrate. In an embodiment, the substrate is a printed circuit board substrate comprising copper and/or polyethylene terephthalate (PET).

Figure 3:
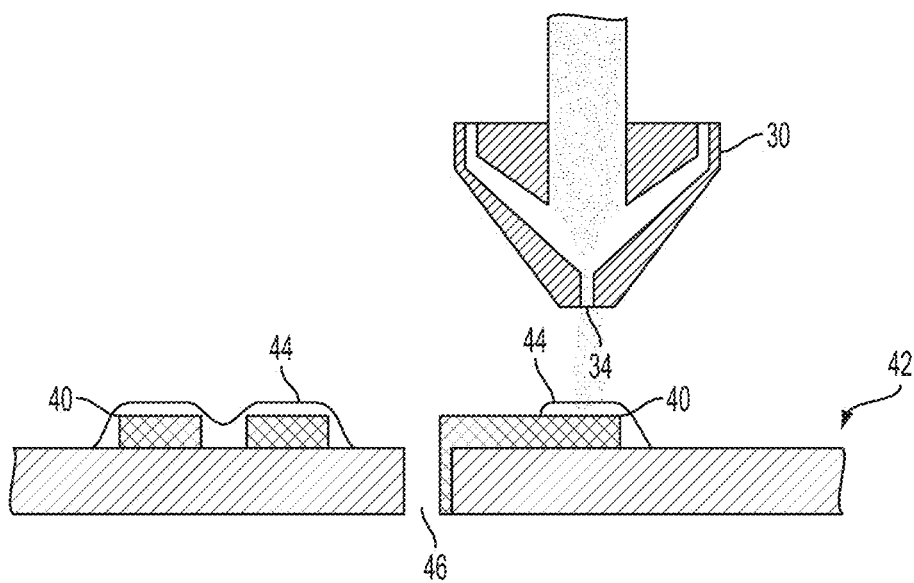
FIG. 3 illustrates a cross-section of a portion of a printed circuit board substrate comprising conductive traces on which a resist mask is deposited by an aerosol printing method, according to an embodiment of the present disclosure.

FIG. 3 illustrates an example of a portion of a printed circuit board substrate 42 comprising conductive traces 40, which can be, for example, copper traces. Resist mask pattern 44 is deposited onto the conductive traces 40 by the aerosol printing method described herein. By controlling the position of the nozzle 34 with respect to the substrate 42, the resist pattern can be selectively deposited on desired portions of the substrate but not deposited in on other portions of the substrate, such as in via hole 46. In an embodiment, the relative position of nozzle 34 can be digitally adjusted with respect to the substrate, such as by using a digital controller to move either or both of the substrate and the nozzle relative to each other.

After the solder mask ink composition is deposited, the resulting resist mask pattern is cured. Curing can be accomplished by any suitable method. Examples of suitable methods known in the art include UV curing and/or thermal curing techniques.

Figure 8:
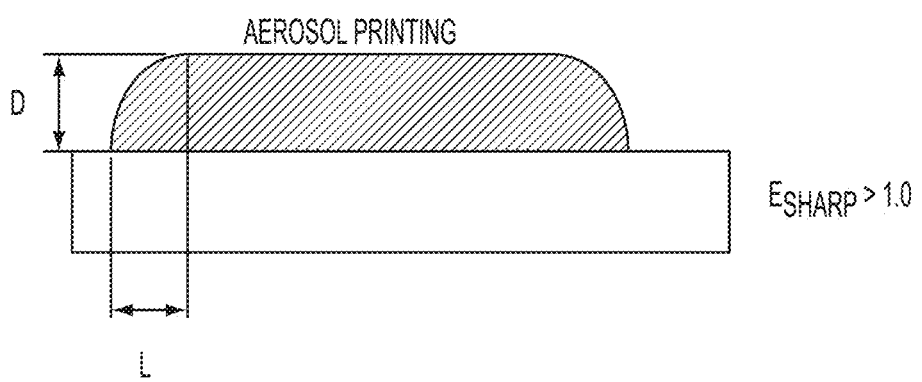
FIG. 8 illustrates an edge profile of a cross section of a solder mask pattern, according to an embodiment of the present disclosure.

The resulting solder mask pattern formed by the aerosol jet printing methods of the present disclosure is distinguishable from solder mask patterns formed by either photolithographic or screen printing techniques. In particular, solder mask patterns formed by aerosol jet printing have an edge sharpness, $E_{sharp}$, that is greater than 1, where $E_{sharp}$ is defined as L/D; L is defined as a lateral length of the edge curvature and D is defined as the thickness of the mask pattern, both as shown in FIG. 8. D can be any suitable amount, such as, for example, from about 5 to about 30 microns, such as about 10 to about 25 microns. L can range, for example, from about 5 to about 30 microns, such as about 10 to about 25 microns. In an embodiment, $E_{sharp}$ for aerosol printed resist masks can range from about 1.2 to about 3, such as about 1.5 to about 2 or 2.5. $E_{sharp}$ for mask patterns formed by photolithographic patterning techniques and screen printing techniques, on the other hand, have values that are less than 1; and in the case of photolithography in particular, are much less than 1.

Deposition of resist masks using aerosol printing can have one or more of the following advantages: 1) It is a digital process that can significantly simplify/reduce the process steps, thus reducing the manufacturing cost; 2) resists are applied digitally onto the desired area, which can reduce materials waste and avoids plugging of via holes; 3) Aerosol printing has been demonstrated for printing high resolution (e.g. 10 micron), and is therefore a potential method for manufacturing high-density resist masks, such as solder masks; 4) Aerosol printing can handle higher ink viscosity (up to 1000 cps), when compared to ink-jet printing; 5) Aerosol printing has been demonstrated as a very good method to printing onto 3D surfaces or surfaces with 3D topography structures.

Given the potential advantages of aerosol printing, the compositions of the present application may be useful for making resist masks, such as solder masks used in printed circuit board ("PCB") manufacturing and/or other epoxy-based resists employed in other applications, such as for printing 3D electronics in the future.

EXAMPLES

Example 1

Composition without Surfactant

A commonly used green solder mask based on bisphenol A epoxy resin was used in the examples below. The commercial solder mask resist (Taiyo S-222NA) was purchased from Taiyo America Inc. The solder mask resist comprised a bisphenol A based epoxy as the main component. The bisphenol A component is shown as Formula 2 below, where n indicates a number of repeating units and can range from about 2 to about 500, such as about 50, 100, 200, 300 or about 400.

Formula 2

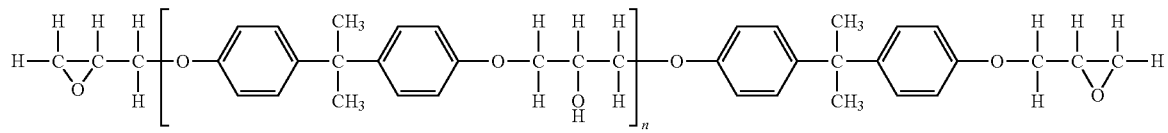

The commercial solder resist had a viscosity of 16,785 cps at a low shear rate of 10 1/s, and 8850 cps at a high shear rate of 485 1/s at 25° C. The viscosity was too high for aerosol jet printing. The target was to re-formulate the commercial solder mask to achieve a viscosity less than 1000 cps at the low shear rate of 10 1/s at 25° C. by using proper additives.

Figure 4:
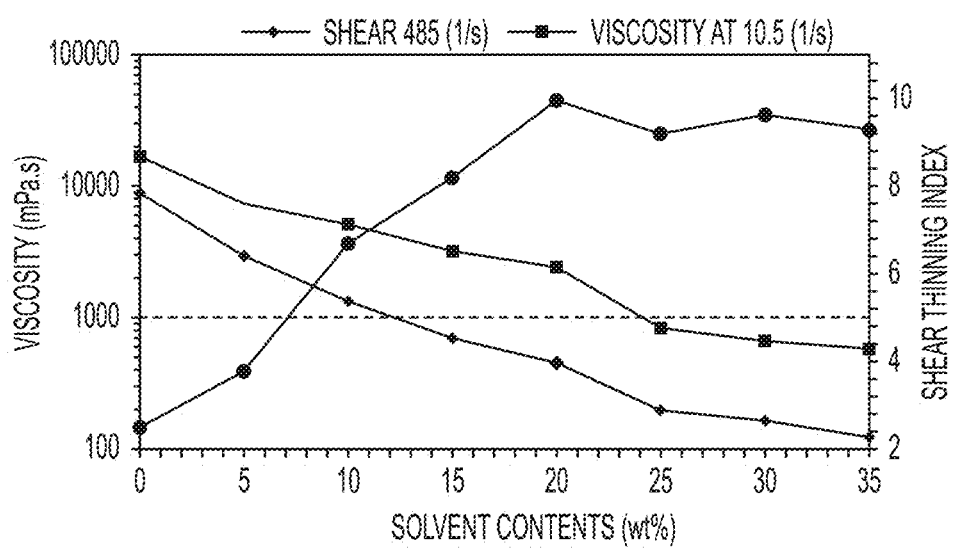
FIG. 4 shows viscosity at 25° C. of example solder resist as a function of solvent addition, according to an example of the present disclosure.

After screening several solvents, butyl carbitol was found to be compatible with the commercial paste and was used as the solvent for dilution. Butyl carbitol has a high boiling point and low vapor pressure, so that it is suitable for aerosol printing. FIG. 4 shows the viscosity (at 25° C.) at both low and high shear rate as a function of the amount of solvent addition. To achieve the target viscosity <1000 cps, 25 to 35 wt % solvent was added. 30 wt % solvent addition was chosen for further study.

Figure 5A:
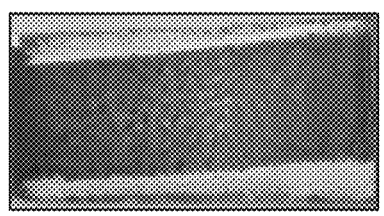
FIGS. 5A to 5E show results of aerosol coating different example solder mask ink formulations with 30 wt % butyl carbitol solvent and different types or amounts of surfactants, including the following.

After adding the butyl carbitol solvent at 30 wt % to the bisphenol A epoxy resin, the resulting low viscosity formulation was coated on a copper cladded FR-4 substrate to test the film forming property. FR-4 is a well known grade of substrate comprising a composite material composed of woven fiberglass cloth with an epoxy resin binder that is flame resistant (self-extinguishing). FIG. 5A shows the coated film with a formulation having 30 wt % butyl carbitol and no surfactant. The film was coated using a slot die coating method. Unfortunately, the film was not smooth and exhibited de-wetting and agglomeration.

Example 2

Compositions with Anionic Surfactant

Figure 5B:
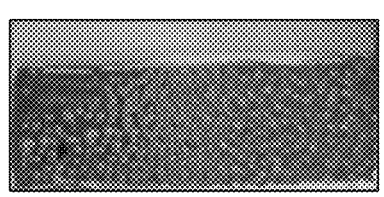
Figure 5C:
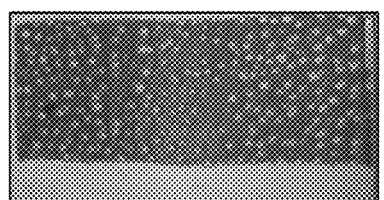

To overcome these issues, different surfactants were tested as additives. FIGS. 5B and 5C respectively show coatings made from different anionic surfactants, Sodium dodecylbenzenesulfonate ("SDBS") (1 wt %) and Sodium dodecyl sulfate ("SDS") (1 wt %), each of which was added to a mixture of butyl carbitol solvent at 30 wt % and the above bisphenol A epoxy resin at 69 wt %. The films were deposited by the same coating method used to deposit the film of FIG. 5A. The addition of anionic surfactant adversely affected the quality of the films, which exhibited pronounced de-wetting phenomenon.

Example 3

Composition with Non-Ionic Surfactant

Figure 5D:
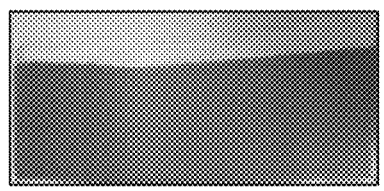
Figure 5E:
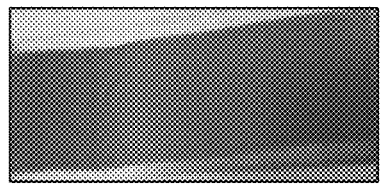

A non-ionic surfactant, Poly(ethylene glycol)-block-poly(propylene glycol)-block-poly(ethylene glycol), was used in place of the anionic surfactants of Example 2. An example of a commercial source of Poly(ethylene glycol)-block-poly(propylene glycol)-block-poly(ethylene glycol) is SYNPERONIC F108, available from Aldrich. FIG. 5D shows the results using SYNPERONIC F108 at 0.5 wt %, butyl carbitol solvent at 30 wt % and the above bisphenol A epoxy resin at 69.5 wt %. FIG. 5E shows the results using SYNPERONIC F108 at 1 wt %, butyl carbitol solvent at 30 wt % and the above bisphenol A epoxy resin at 69 wt %. As indicated by the results shown in FIGS. 5D and 5E, smooth films with excellent wetting properties on the copper surface were obtained for both formulations.

Example 4

Scratch Resistance, Adhesion and Solvent Resistance Testing of the Re-Formulated Solder Mask Materials The formulation of Example 3 with 1.0 wt % SYNPERONIC F108 surfactant was chosen to investigate whether the solvent and the surfactant had adverse effects on the final cured solder mask. The formulation was coated on a copper substrate and cured at 140° C. for 35 min as recommended for the commercial formulation.

Figure 6:
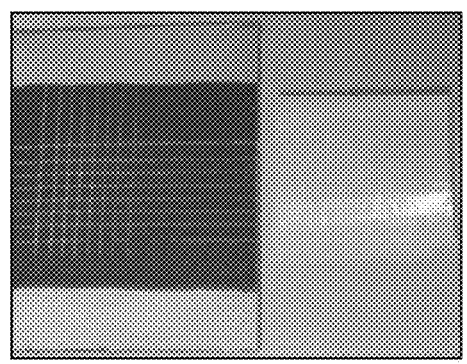
FIG. 6 shows the results of an adhesion test, as discussed in the examples of the present disclosure.

After curing, the film was subjected to scratch resistance, pencil hardness and solvent resistance testing. The scratch resistance, pencil hardness and solvent resistance were tested according to the IPC-SM-840C Class H, Solder mask vendor testing requirements. The adhesion testing was carried out using standard cross-cut adhesion testing, as described in ASTM Test Method D 3359, method B and DIN Standard No. 53151. As shown in FIG. 6, no material was transferred to the tape during the adhesion test, indicating an adhesion of 5B (excellent adhesion) and excellent scratch resistance. The results of hardness testing indicated a pencil hardness of 6H.

The reformulated solder mask passed all required solvent resistance tests. The results of the solvent resistance testing are shown in Table 1.

TABLE 1

| Solvent | Pass? |
| --- | --- |
| Isopropanol | Yes |
| 75% isopropanol/25% water | Yes |
| R-Limonene | Yes |
| Monoethanolamine | Yes |
| DI water | Yes |

The results for adhesion testing, scratch resistance, hardness testing and solvent resistance are substantially the same as those achieved for the commercial solder mask made without the added solvent and surfactant, indicating the addition of solvent and the surfactant had little or no adverse effects on the cured solder mask.

Example 5

Aerosol Printing of the Reformulated Solder Mask Materials

The above formulation of Example 3 with 1.0 wt % Synperonic F108 surfactant was printed with an aerosol printer equipped with a pneumatic atomizer at about 50° C. A 1 mm nozzle was used and the atomization gas was set at 1000 to 1300 SCCM, the exhaust was at 900 to 1200 SCCM and the sheath gas was at 200 to 600 SCCM. Aerosol was generated at such printing conditions.

The flow rate of aerosol was tested to be around 2 to about 2.6 mg/min of dry solder mask materials for a single nozzle. Assuming a density of 1.5 g/cm$^3$ for the dry solder mask material, this weight-based flow rate is about 1.3-1.7×10$^{-3}$ cm$^3$/min volume-based flow rate, which is comparable or even higher than other aerosol inks (e.g. silver nanoparticle ink has a weight-based flow rate of 8-12 mg/min, which corresponding to a volume-based flow rate of 0.8-1.2×10$^{-3}$ cm$^3$/min).

Figure 7A:
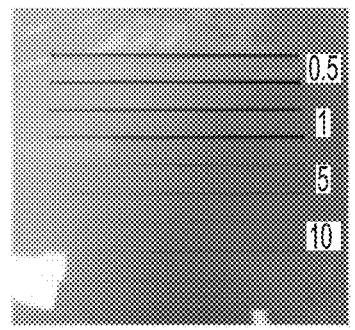
FIGS. 7A, 7B, 7C and 7D show images of solder mask resist lines printed at different speeds, as discussed in the examples of the present disclosure.
Figure 7B:

The ink was printed on both polyethylene terephthalate (PET) and copper cladded FR-4 substrates, which are typical substrates used for printed circuit boards. FIG. 7A shows solder mask lines printed at different speeds using the 1 mm nozzle on a PET substrate. The speed is labeled, from top to bottom, 0.5, 1.0, 5, 10, and 20 mm/s. FIG. 7B shows solder mask lines printed using the 1 mm nozzle on a copper cladded FR-4 substrate. In FIG. 7B, the speed for the top line is 1 mm/s and the speed for the bottom line is 2 mm/s. One can see that uniform lines were obtained on both substrates. The printed lines showed excellent adhesion, pencil hardness, scratch resistance and chemical resistance as was exhibited by the aforementioned coating. For this particular example test, it was found out that the printing speed of 5 mm/s gave the best line edge smoothness, and the desired thickness.

Figure 7C:
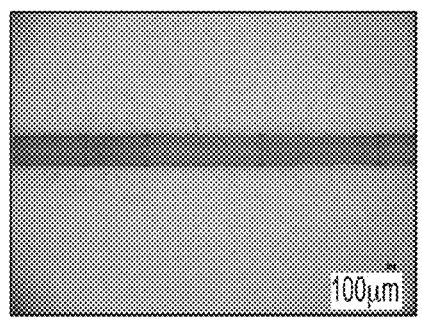
Figure 7D:
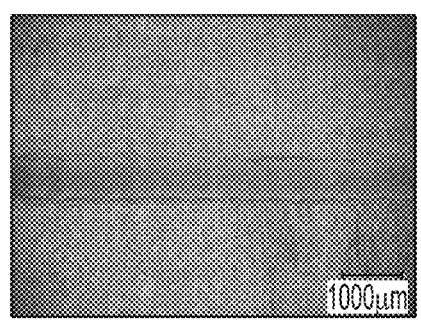

FIGS. 7C and 7D respectively show optical images of solder mask lines printed on PET and copper cladded FR-4 substrates, both at 5 mm/s. Well defined lines with smooth edges were obtained. The thickness was measured to 10 to 15 microns, and the line width is about half of the nozzle size. It should be noted that the thickness, line width, and the line edge profile could be tuned by using different nozzles and by adjusting printing conditions as desired.

The above examples show that aerosol printing can be used to print resist masks from resist formulations of the present disclosure having a viscosity <1000 cps at shear rate of 10 1/s at 25° C. The resist formulations could be obtained by diluting epoxy resin with, for example, butyl carbitol solvent and a non-ionic surfactant. These re-formulated solder mask formulation showed good printability in an aerosol jet printer, and the printed mask exhibited the same adhesion, pencil hardness, scratch resistance, and chemical resistance as the commercial one.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein.

While the present teachings have been illustrated with respect to one or more implementations, alterations and/or modifications can be made to the illustrated examples without departing from the spirit and scope of the appended claims. In addition, while a particular feature of the present teachings may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." Further, in the discussion and claims herein, the term "about" indicates that the value listed may be somewhat altered, as long as the alteration does not result in nonconformance of the process or structure to the illustrated embodiment. Finally, "exemplary" indicates the description is used as an example, rather than implying that it is an ideal.

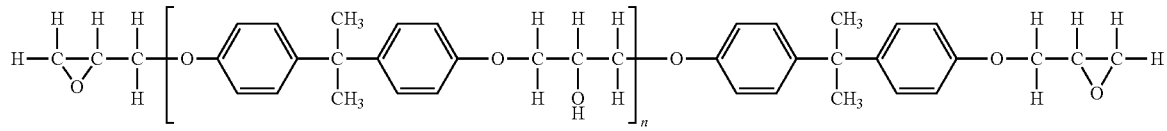

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompasses by the following claims.

What is claimed is:

1. A method of digitally printing a solder mask, the method comprising:
providing a solder mask ink composition comprising: 1) a resin and 2) a solvent in an amount of at least 20% by weight relative to the total weight of the solder mask ink composition, wherein the composition has a viscosity that is less than 1000 cps at a shear rate of $10 \text{ s}^{-1}$ and a temperature of 25° C.;
generating an aerosol stream from the solder mask ink composition with a pneumatic atomizer using an atomization gas;
directing the aerosol stream through a nozzle and focusing the aerosol stream using a sheath gas onto a substrate while changing the position of the nozzle with respect to the substrate to selectively deposit a solder mask pattern; and
curing the solder mask pattern.

2. The method of claim 1, wherein the solder mask ink composition has a viscosity that is less than 1000 cps at a shear rate of $10 \text{ s}^{-1}$ and greater than 30 cps at a shear rate of $495 \text{ s}^{-1}$ at a temperature of 25° C.

3. The method of claim 1, wherein the solder mask ink composition has a viscosity that is less than 800 cps at a shear rate of $10 \text{ s}^{-1}$ and greater than 50 cps at a shear rate of $495 \text{ s}^{-1}$ at a temperature of 25° C.

4. The method of claim 1, wherein the substrate is a printed circuit board substrate comprising conductive traces.

5. The method of claim 1, wherein a flow rate of the aerosol steam comprises at least of 2.0 mg/min dry weight of solder mask resist.

6. The method of claim 1, wherein the nozzle is from about 100 micron to about 10 mm in size, the atomization gas has a flow rate ranging from about 900 to about 1400 SCCM, and the sheath gas has a flow rate ranging from about 200 to about 1300 SCCM.

7. The method of claim 6, wherein the atomization gas flow rate is about 50 to about 200 SCCM greater than the flow rate of the sheath gas.

8. The method of claim 1, wherein the resin is an epoxy resin selected from the group consisting of a bisphenol A epoxy resin, a phenol formaldehyde resin, an acrylic acid modified epoxy and a cycloaliphatic or heterocyclic rings based epoxy with one or more crosslinkers selected from the group consisting of phenols, amines, and anhydrides.

9. The method of claim 1, wherein the epoxy resin is a bisphenol A epoxy resin.

10. The method of claim 1, wherein the epoxy resin has a formula 1 where n ranges from about 2 to about 500.

11. The method of claim 1, wherein the solvent has a boiling point that is at least 135° C. at atmospheric pressure, and a vapor pressure of less than 5 mm Hg at 20° C.

12. The method of claim 1, wherein the solvent is selected from the group consisting of a dialkylene glycol monoalkyl ether, alkoxybenzene, $C_5$ to $C_8$ alcohol and a $C_2$ to $C_4$ alkanediol.

13. The method of claim 12, wherein the dialkylene glycol monoalkyl ether is selected from the group consisting of a diethylene glycol monoalkyl ether and a dipropylene glycol monoalkyl ether.

14. The method of claim 1, wherein the solvent is butyl carbitol.

15. The method of claim 1, wherein the composition further comprises a non-ionic surfactant.

16. The method of claim 15, wherein the non-ionic surfactant is selected from the group consisting of a polyalkylene glycol, polysorbates, polyglycerol polyricinoleate, Octadecanoic acid [2-[(2R,3S,4R)-3,4-dihydroxy-2-tetrahydrofuranyl]-2-hydroxyethyl]ester, Octadecanoic acid [(2R,3S,4R)-2-[1,2-bis(1-oxooctadecoxy)ethyl]-4-hydroxy-3-tetrahydrofuranyl]ester, $C_8$ to $C_{22}$ long chain alcohols, substituted or unsubstituted octylphenol, polyethylene glycol monoisohexadecyl ether; dodecanoic acid 2,3-dihydroxypropyl ester; glucosides, fatty acid amides, and non-ionic surfactants that have a hydrophilic polyethylene oxide chain and an aromatic hydrocarbon lipophilic or hydrophilic group.

17. The method of claim 15, wherein the non-ionic surfactant is a block co-polymer comprising at least one polyethylene glycol block and at least one polypropylene glycol block.

18. A method of aerosol printing a resist mask, the method comprising:
providing an ink composition comprising: 1) an epoxy resin and 2) a solvent in an amount of at least 20% by weight relative to the total weight of the ink composition, wherein the composition has a viscosity that is less than 1000 cps at a shear rate of 10 s$^{-1}$ and a temperature of 25° C.;

generating an aerosol stream from the ink composition with a pneumatic atomizer using an atomization gas;

directing the aerosol stream through a nozzle and focusing the aerosol steam using a sheath gas onto a substrate while changing the position of the nozzle with respect to the substrate to selectively deposit a resist mask pattern; and curing the resist mask pattern.

19. The method of claim 18, wherein the solvent is a diethylene glycol monoalkyl ether of the formula:

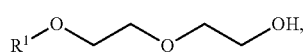

where R$^1$ is a C$_3$ to C$_6$ alkyl group.

* * * * *